(12) United States Patent
Chung et al.

(10) Patent No.: US 6,403,431 B1
(45) Date of Patent: Jun. 11, 2002

(54) METHOD OF FORMING IN AN INSULATING LAYER A TRENCH THAT EXCEEDS THE PHOTOLITHOGRAPHIC RESOLUTION LIMITS

(75) Inventors: Tae-Young Chung, Kyunggi-do; Hyung-Soo Uh, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 86 days.

(21) Appl. No.: 09/632,582

(22) Filed: Aug. 7, 2000

(30) Foreign Application Priority Data

Aug. 6, 1999 (KR) .............................. 99-32303

(51) Int. Cl.[7] .................. H01L 21/336; H01L 21/4763; G03C 5/00; G03C 5/10
(52) U.S. Cl. ...................... 438/296; 438/637; 430/313; 430/314; 430/315; 430/396
(58) Field of Search ................................ 438/296, 637; 430/313, 314, 396, 315

(56) References Cited

U.S. PATENT DOCUMENTS

| | | | |
|---|---|---|---|
| 5,072,266 A | * 12/1991 | Bulucea et al. | |
| 5,298,442 A | * 3/1994 | Bulucea et al. | |
| 5,792,693 A | 8/1998 | Tseng | 254/438 |
| 5,837,578 A | 11/1998 | Fan et al. | 254/438 |

\* cited by examiner

*Primary Examiner*—John F. Niebling
*Assistant Examiner*—Ron Pompey
(74) *Attorney, Agent, or Firm*—Marger Johnson & McCollom, P.C.

(57) ABSTRACT

The present invention provides a method of forming in an insulating layer a trench that has a minimum feature size exceeding photolithographic resolution limits. The trench is formed by a two-step photolithographic process. The two-step photolithographic process defines a trench mask pattern with a rectangular or/and square shape. The first step photolithographic process defines a plurality of first patterns parallel with each other on the insulating layer. The second step photolithographic process defines a plurality of second patterns on the first patterns and on the insulating layer. The second patterns intersect the first patterns, defining the trench mask pattern. The trench mask pattern is partially etched to form a trench mask pattern with reduced feature sizes exceeding the photolithographic resolution limits. Using the trench mask pattern with reduced feature sizes, the insulating layer is etched to form the trench with a good etching profile and smaller feature sizes, thus facilitating semiconductor circuit densification.

16 Claims, 14 Drawing Sheets

METHOD OF FORMING IN AN INSULATING LAYER A TRENCH THAT EXCEEDS THE PHOTOLITHOGRAPHIC RESOLUTION LIMITS

BACKGROUND OF THE INVENTION

1. Field of the Invention

The present invention relates to a method of forming a trench in an insulating layer, and more particularly to a method for fabricating a cell capacitor of cylindrical type in the trench.

2. Description of the Related Art

Recent advances in the miniaturization of integrated circuits have led to smaller wafer areas available for devices. High density DRAMs, for example, leave little room for the storage nodes of memory cells. Yet even as the footprint (an area of a silicon wafer allotted for an individual memory cell) shrinks, the storage nodes must maintain a certain minimum charge storage capacity, determined by design and operational parameters to ensure reliable operation of the memory cells. It is thus increasingly important that capacitors achieve a high stored charge storage per unit area of the wafer.

In DRAM cells, charges stored in the capacitor are drained continuously. Therefore, periodic refresh operation is needed to keep charges within the capacitor at a certain level, which can be read. As is well known, frequency of refresh operation is inversely proportional to capacitance of the capacitor. During this refresh operation, read and write operations are impossible. Accordingly, DRAM devices with high capacitance are needed to keep pace with recent trends of high density and high operational speed. Accordingly, several techniques have been recently developed to increase the total charge capacity of the cell capacitor without significantly affecting the wafer area occupied by the cell.

In a capacitor, a dielectric material is deposited between two conductive layers, which form the capacitor plates or electrodes. The amount of charge stored on the capacitor is proportional to the capacitance. $C = \in \times \in_0 \times A/d$, where $\in$ is the dielectric constant of the capacitor dielectric, $\in_0$ is vacuum permittivity, A is the electrode area, and d represents the spacing between electrodes. Some techniques for increasing capacitance include the use of new materials having higher dielectric constants.

Other techniques concentrate on increasing the effective surface area ("A") of the electrodes by creating folding structures such as stacked capacitors. Such structures better utilize the available chip area by creating three-dimensional shapes to which the conductive plates and capacitor dielectric conform. Such stacked capacitors include, for example double-stacked, fin stacked, cylindrical, spread-stacked, and box-structured capacitors.

Since both the outer and inner surfaces can be utilized as an effective capacitor area, the cylindrical structure is favored over the three-dimensional stacked capacitor, and is more particularly suitable for highly-integrated memory cells.

U.S. Pat. Nos. 5,362,666, 5,728,618, 5,753,547, the disclosures of which are incorporated herein by reference, disclose methods for fabricating a cylindrical capacitor with a single trench etch mask.

Conventionally, cylindrical capacitors are formed by the process of depositing a thick sacrificial oxide layer, etching the sacrificial oxide layer to form trenches by using a single trench etch mask, depositing a storage node material and isolating each cell from one another to form storage nodes. As a DRAM cell scales down to a sub-quarter micron level minimum feature size. It is, however, very difficult to form a photoresist pattern defining the trench regions using current photolithographic processes. Also, the patterned photoresist layer has a round configuration at the corner thereof (so-called "rounding effect"), reducing the dimension of the trenches in the oxide layer (i.e., increasing space between the trenches) and resulting in a reduced surface area of the storage node. Also, the oxide layer may not be sufficiently etched (so-called "not opening phenomenon" of the contact window) and uniformity of the trenches may not be ensured.

Accordingly, there is a need for a method for fabricating trenches in the oxide layer that can allow the formation of trenches exceeding photolithographic resolution limits (i.e., decreasing the space between the trenches) along with uniformity thereof

SUMMARY OF THE INVENTION

The present invention is directed toward providing a method of forming a trench in an insulating layer that can exceed the photolithographic resolution limits and can provide a uniformity of the trench, and more particularly directed toward providing a method for fabricating a cylindrical capacitor in the trench.

A feature of the present invention is the formation of a trench-etching mask exceeding the photolithographic resolution limits. The trench-etching mask can be formed using a two-step photolithographic process. First line patterns are formed on the sacrificial oxide layer. The first line patterns are parallel and spaced apart from one another. The gap or space dimension between adjacent patterns corresponds to the dimension of the storage node measured at the longer direction thereof. Then, second line patterns are formed on the first line patterns and on the sacrificial oxide layer, intersecting the first patterns and defining a trench etching mask. The second line patterns are also parallel and spaced apart from one another. The gap or space dimension between adjacent patterns corresponds to the dimension of the storage node measured at the shorter direction thereof. Namely, the intersecting first and second patterns define rectangular configuration trench areas, which define a rectangular storage node configuration. Using this pattern, the underlying sacrificial oxide layer is etched to form trenches with good etching profile while avoiding not opening and rounding phenomena.

Furthermore, in order to increase trench areas, the resulting trench etching mask is then etched partially to form a trench-etching mask that exceeds photolithographic resolution limits. The etching of the trench-etching mask can be carried out by wet etching using a wet chemical. Also, etching of the trench etching mask can be carried out by the process of forming an oxide layer by dry oxidation on the trench etching mask and then etching the resulting oxide layer.

Briefly, in accordance with the present invention, there is provided a method of forming a trench in a sacrificial oxide layer in semiconductor manufacturing. The method comprises depositing an insulating layer on a semiconductor topology. A first plurality of spaced-apart and parallel patterns are formed on the insulating layer. The first patterns are made of a material that has an etching selectivity with respect to the insulating layer. For example, polysilicon, nitride and alumina can be used. A second plurality of spaced-apart and parallel patterns are formed on the insulating layer and on the first patterns so as to intersect the first patterns. The second patterns are made of a material that has an etching selectivity with respect to the insulating layer. For example, polysilicon, nitride, and alumina can be used. The intersecting first and second patterns define a trench mask pattern. Using the trench mask pattern, the underlying insulating layer is etched to form a plurality of trenches to the semiconductor topology.

According to an aspect of the above-mentioned method, the trench-etching mask can be partially etched to enlarge the trench areas defined by the trench-etching mask. Enlarging the trenches can be carried out by wet etching using a wet chemical. Alternatively, enlarging the trench is carried out by the process of oxidizing the trench mask and then etching the resulting oxide layer. Accordingly, a finer pattern, than can be printed by the photolithographic resolution is obtained. Also, with a relaxed design rule, desired pattern size can be obtained and increased semiconductor circuit density.

In accordance with the present invention, there is provided a method of forming a trench in an insulating layer in a semiconductor manufacturing. The method comprises forming an insulating layer on a semiconductor topology. The semiconductor topology includes a semiconductor substrate, transistors formed thereon, landing pads formed on the substrate between the transistors, an insulator formed on the substrate including the transistors and landing pads, and a bit line formed on the insulator. Contact plugs are formed in the insulating layer to the landing pad. A first plurality of spaced-apart and parallel patterns are formed on the insulating layer. A second plurality of spaced-apart and parallel patterns are formed on the first pattern to intersect the first patterns, wherein intersecting first and second patterns define a trench mask pattern. Using the intersecting first and second patterns, the insulating layer is etched to form a plurality of trenches to the contact plug. A conductive layer is formed in the trenches to the contact plugs. The conductive layer is planarized until a top surface of the insulating layer is exposed, thereby forming a storage node.

In accordance with the present invention, there is provided a method of forming a trench in an insulating layer in semiconductor manufacturing. The method comprises forming a transistor on a semiconductor substrate. A first insulating layer is formed on the semiconductor substrate including the transistor and the landing pad. A contact plug is formed in the first insulating layer to be electrically connected to the landing pad. A second insulating layer is formed on the first insulating layer including the contact plug. A first plurality of spaced apart and parallel patterns are formed on the second insulating layer. The first pattern is made of a material that has an etching selectivity with respect to the second insulating layer. For example, polysilicon, nitride, and alumina can be used. A second plurality of spaced-apart and parallel patterns are formed on the first patterns to intersect the first patterns, wherein intersecting first and second patterns define a trench mask pattern. The second patterns are also made of a material that has an etching selectivity with respect to the second insulating layer.

Preferably, the second patterns are made of the same material as the first patterns. The resulting trench mask pattern can be further etched to enlarge the area of trench (i.e., reducing the distance between adjacent trench mask pattern). Using the intersecting first and second patterns, the underlying second insulating layer is etched to form a trench to the contact plug. Resulting trench formed in the second insulating layer has an excellent etching profile and a substantially rectangular configuration. A conductive material such as polysilicon is formed in the trench and on the second insulating layer. A third insulating layer is formed in the remainder of the trench and on the second insulating layer. The third insulating layer and the conductive material are planarized until a top surface of the second insulating layer is exposed, thereby forming a storage node.

BRIEF DESCRIPTION OF THE DRAWINGS

The above features and advantages of the invention will become apparent upon reference to the following detailed description of specific embodiments and the attached drawings, of which:

FIGS. 3A to 8A are cross-sectional views of a semiconductor substrate showing a method of forming a cylindrical capacitor, taken along line A—A of FIG. 1;

FIGS. 3B to 8B are cross-sectional views of a semiconductor substrate showing a method of forming a cylindrical capacitor, taken along line B—B of FIG. 1.

DETAILED DESCRIPTION OF THE PREFERRED EMBODIMENTS

Figure 1:
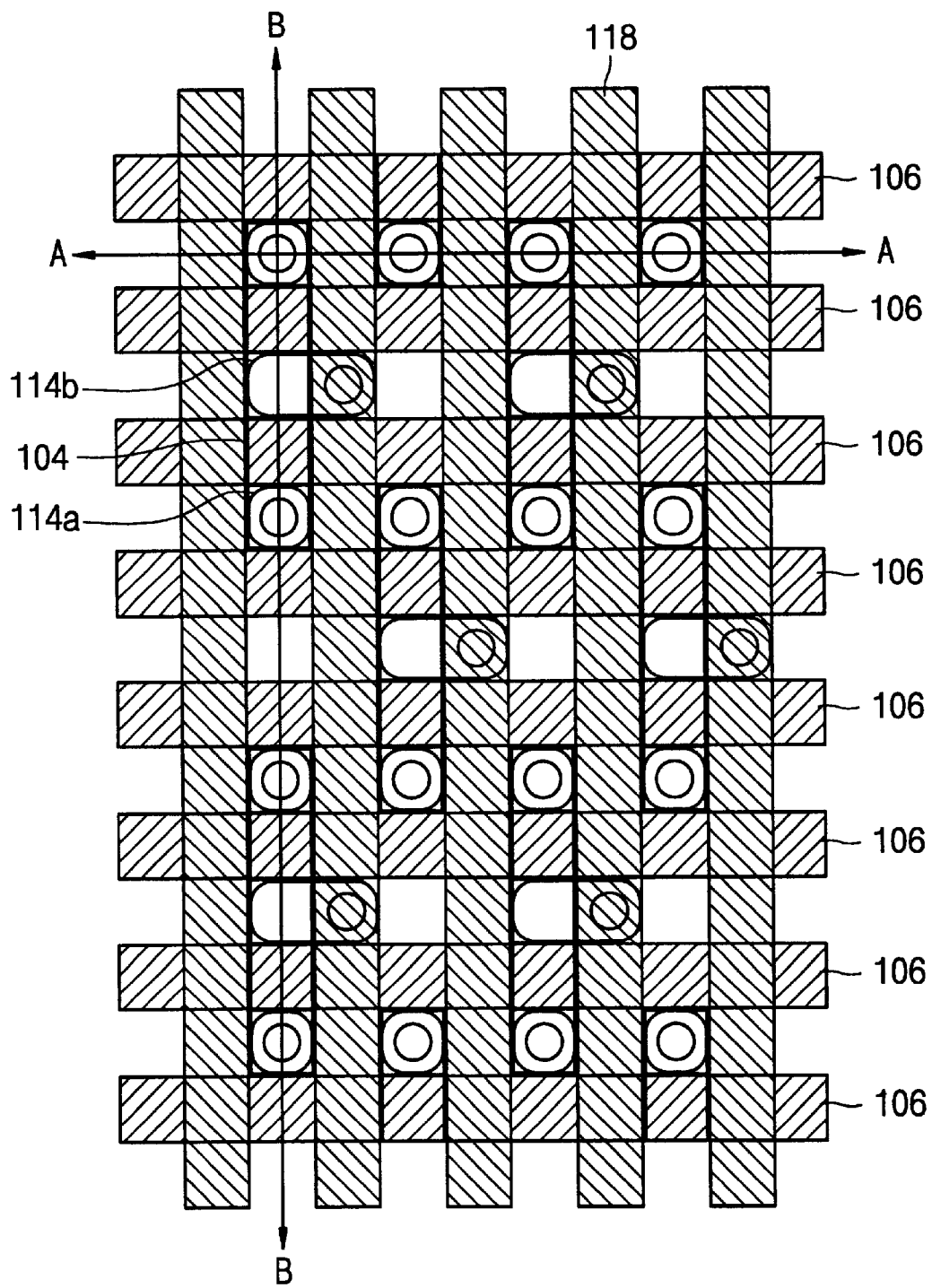
FIG. 1 is a top plan view showing intersecting gate lines and bit lines and active regions according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

The formation of the DRAM cell includes many process steps that are well known in the art. For example, the process of photolithography masking and etching is used extensively in several embodiments of the present invention. One standard photolithographic process includes creating a photolithography mask containing the pattern of the component to be formed, coating the wafer with a light sensitive-material, known as a photoresist, exposing the photoresist coated wafer to ultra-violet light through the mask to soften or harden parts of the photoresist (depending on whether positive or negative photoresist is used), removing the materials left unprotected by the photoresist and then stripping the remaining photoresist. Another well-known process that is used extensively in this and many other integrated circuit fabrication processes is chemical mechanical polishing (CMP). These and other standard processes are referred to extensively herein without a detailed discussion.

The present invention relates to methods for forming trenches in an insulating layer. The trenches formed in the insulating layer have a good profile and are dimensioned to exceed the photolithographic resolution limits. These methods can be applicable to many semiconductor manufacturing processes such as trench formation for a cylindrical capacitor process, contact formation for fine landing pads and metal contacts and are applicable most preferably to a method for fabricating a cylindrical capacitor in the trench Trenches are formed by using a trench mask pattern, which comprises two intersecting line patterns of first parallel patterns and second parallel patterns intersecting the first patterns. The intersecting line patterns define the trench mask pattern. The patterns are formed of a material that has an etching selectivity with respect to underlying insulting layer. If the underlying insulating layer is an oxide, the mask pattern can be made of polysilicon, nitride, or alumina, preferably made of polysilicon. Using the resulting trench mask pattern, the underlying insulating layer is etched to form trenches therein. Resulting trenches have excellent etching profiles of a substantially right angle at the corner portions thereof.

A conductive material is deposited in the trenches. In case of landing pad and metal contact formation, the trenches are completely filled with the conductive material and planarized to form the landing pad and the metal plug, respectively. In case of the cylindrical capacitor, a thin layer of conductive material is deposited partially filling the trenches and a planarization insulating layer is then deposited in the remainder of the trenches.

The preferred embodiment of the present invention for a cylindrical capacitor will now be described with reference to the accompanying drawings. The process for forming the field oxide layer and the field effect transistor structure as presently practiced in manufacturing DRAM cells is only briefly described in order to better understand the current invention.

FIG. 1 schematically shows a top plan view of a semiconductor substrate showing active regions, gate lines and bit lines. In FIG. 1, various insulating layers formed between conductive layers are not shown for clarity and simplicity. As illustrated in FIG. 1, active regions 104 are defined on the substrate. The active regions 104 resemble rectangular configuration. As an example, active regions 104 each have a dimension of about 0.1 microns×0.5 microns under the design rule of 0.1 microns. In case of a design rule of 0.13 microns, each of active regions 104 has a dimension of about 0.13 microns×0.65 microns. Gate lines 106 intersect the active regions 104. Bit lines 118 intersect the gate lines 106. Storage node contact pads 114a are formed at both ends of the active regions 104. Bit line contact pads 114b are formed on the active regions and extend into the inactive regions. Storage nodes are electrically connected to the storage node contact pads through storage node contacts, and the bit lines are electrically connected to the bit line contact pads through bit line contacts.

Figure 2:
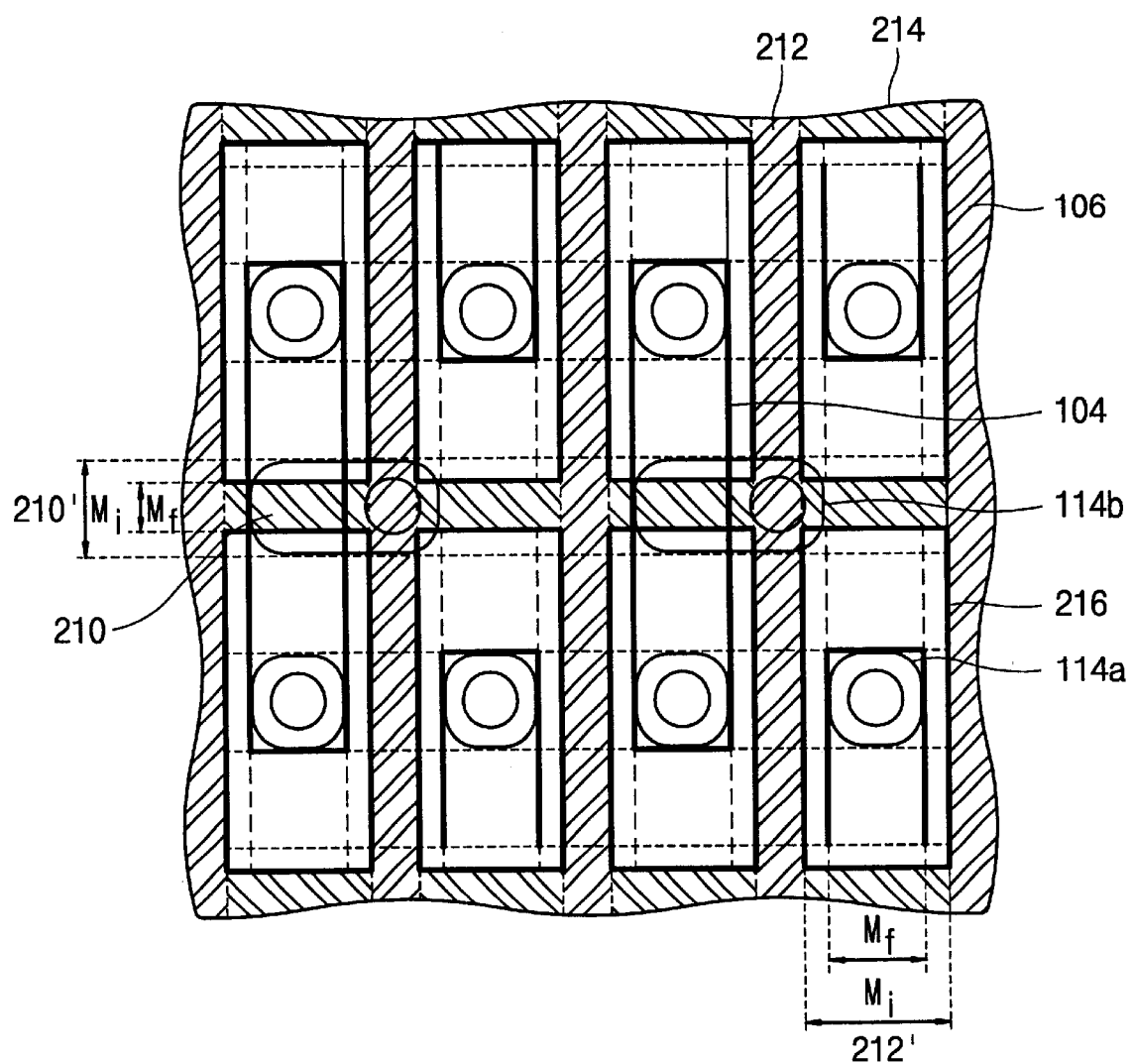
FIG. 2 is a top plan view showing a trench mask according to the embodiment of the present invention.

FIG. 2 schematically shows a top plan view of a trench etching mask. The trench etching mask 214 defines a plurality of substantially rectangular trenches 216. The trench etching mask 214 is made of two intersecting line patterns (212, 210) of polysilicon. Using mask 214, the underlying insulating layer is etched to form trenches in which a conductive material is to be deposited. According to the present invention, the trench etching mask 214 can have a minimum feature size of 0.05 microns under the design rule of 0.1 microns to 0.13 microns. Namely, the trench etching mask 214 can have a minimum feature size of 0.05 microns that exceeds the design rule of 0.1 microns. The formation of trench etching mask 214 exceeding the design rule can be done by the process of wet etching of initial etching mask of 0.1 microns minimum feature size (see $210'M_i$ and $212'M_i$).

Alternatively, the trench etching mask 214 exceeding the design rule can be formed by the process of oxidizing the initial trench etching mask and etching the oxidized portions. The resulting trench 216 has a dimension of about 0.15 microns×0.25 microns with respect to 0.1 microns minimum feature size and has a dimension of about 0.21×0.34 with respect to 0.13 minimum feature size. FIGS. 3A to 8A are cross-sectional views of a semiconductor substrate showing a method of forming a cylindrical capacitor, taken along line A—A of FIG. 1. FIGS. 3B to 8B are cross-sectional views of a semiconductor substrate showing a method of forming a cylindrical capacitor, taken along line B—B of FIG. 1. The formation of cylindrical capacitor with increased surface area and reliability will be fully described hereinafter. For better understanding the current invention, cross-sections taken along word line direction(line A—A) and bit line direction(B—B) are simultaneously referenced.

Figure 3A:
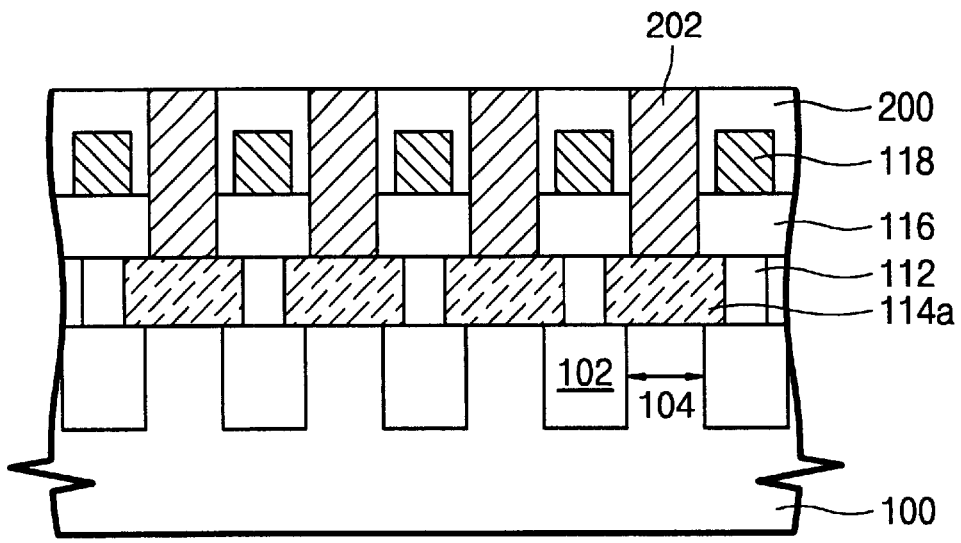
Figure 3B:
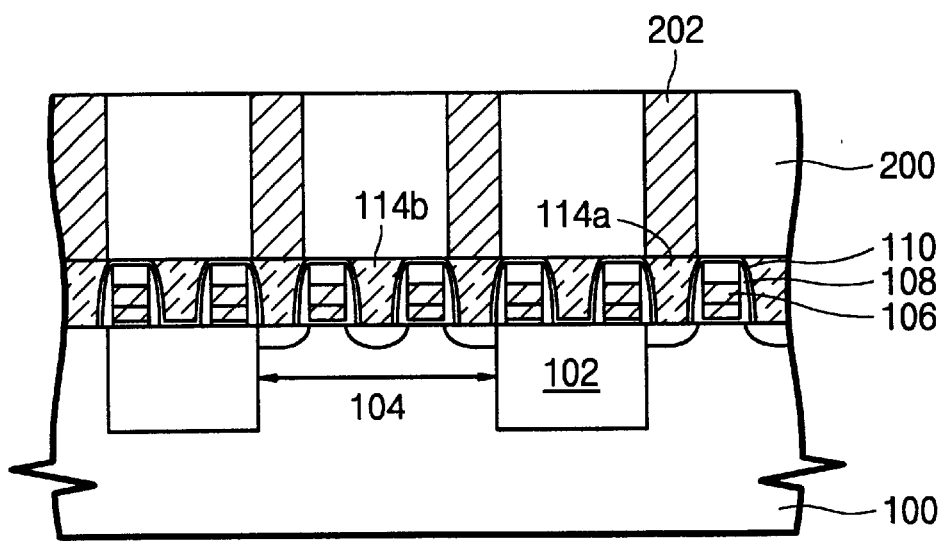

FIGS. 3A and 3B are cross-sectional views of a semiconductor substrate already subjected to several process steps according to the present invention. More particularly, there is provided a semiconductor substrate 100, preferably a silicon substrate. A device isolation process is carried out to define active regions 104 and inactive regions 102. The active region 104 resembles a rectangular shape. The device isolation process may include a shallow trench isolation (STI), a local oxidation of silicon (LOCOS), or the like. The dimension of the active region 104 depends on the design rule. For example, the active region 104 has a dimension of about 0.1 microns×0.5 microns under the design rule of 0.1 microns and has a dimension of about 0.13 microns×0.65 microns under the design rule of 0.13 microns.

The present invention uses a shallow trench isolation technique. Briefly, using a mask, the substrate 100 is etched to form an STI trench wit h a depth of about 2,000 Angstroms to 2,500 Angstroms. Etching the substrate 100 uses a mixed gas containing $Cl_2$, HBr and $CF_4$. A thermal oxide is grown on the STI trench and a nitride liner is deposited on the thermal oxide layer. The remainder of the STI trench is filled up with an insulating material such as HDP (high density plasma) oxide. A planarization process is carried out and the mask is removed to complete the device isolation process.

Next, gate lines 106 are formed. The gate lines 106 are formed to intersect the active regions 104 (see FIG. 1). For electrical separation between the gate lines and the substrate, a gate oxide is disposed therebetween. The gate line is formed of a gate electrode and a capping layer. The gate electrode is formed of a double layer of about 500 to 800 Angstroms doped polysilicon and about 800 to 1,200 Angstroms tungsten silicide thereon. The capping layer is preferably a nitride layer. After formation of the gat lines 106, a conventional ion implantation process is carried out to form source/drain regions adjacent the gate lines 106. Sidewall spacers 108 are formed on sidewalls of the gate lines 106. The sidewall spacers are formed of nitride.

Next, self-aligned contacts (SACs) are formed. A thin layer of nitride 110 is deposited on the resulting structure as an SAC etch stopper. An oxide layer 112 is deposited on the nitride stopper 110 to fill the space between the gate lines 106. Through a photolithographic process, SACs are opened in the selected portions of the oxide layer 112 to the substrate 100. SAC openings are filled with a conductive material such as a doped polysilicon and planarized to form cell landing pads 114a and 114b for storage nodes and bit lines, respectively. The cell landing pads 114a and 114b have a height of about 3,000 angstroms to 4,000 angstroms.

Next, bit lines are formed. A first interlayer insulating layer 116 is deposited on the pads 114a and 1 14b and on the oxide layer 112. Selected portions of the first interlayer insulating layer 116 are etched to form first openings (bit line contacts) to the cell landing pads 114b for the bit lines (see FIG. 1 and FIG. 2). A conductive material is deposited in the first opening and on the first interlayer insulating layer 116 and patterned to form bit lines 118. The bit lines 118 are formed of about 400 Angstroms titanium nitride and about 800 Angstroms tungsten. Then, a second interlayer insulating layer 200 is deposited on the first interlayer insulating layer 116 including the bit lines 118.

In turn, selected portions of the second and first interlayer insulating layers 200 and 116 are etched to form second openings (storage node contact) to the cell landing pad 114a for storage nodes. The second openings are filled with a conductive material such as a doped polysilicon and planarized to form buried contact plugs 202.

Figure 4A:
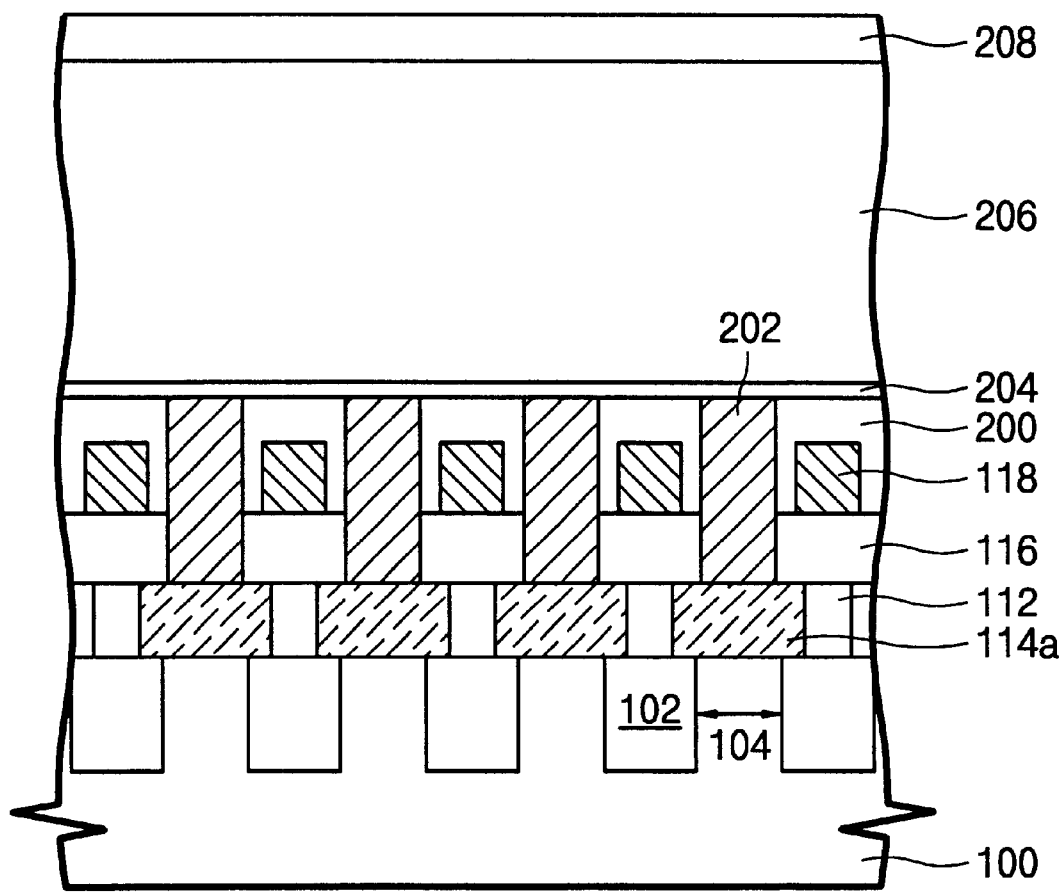
Figure 4B:
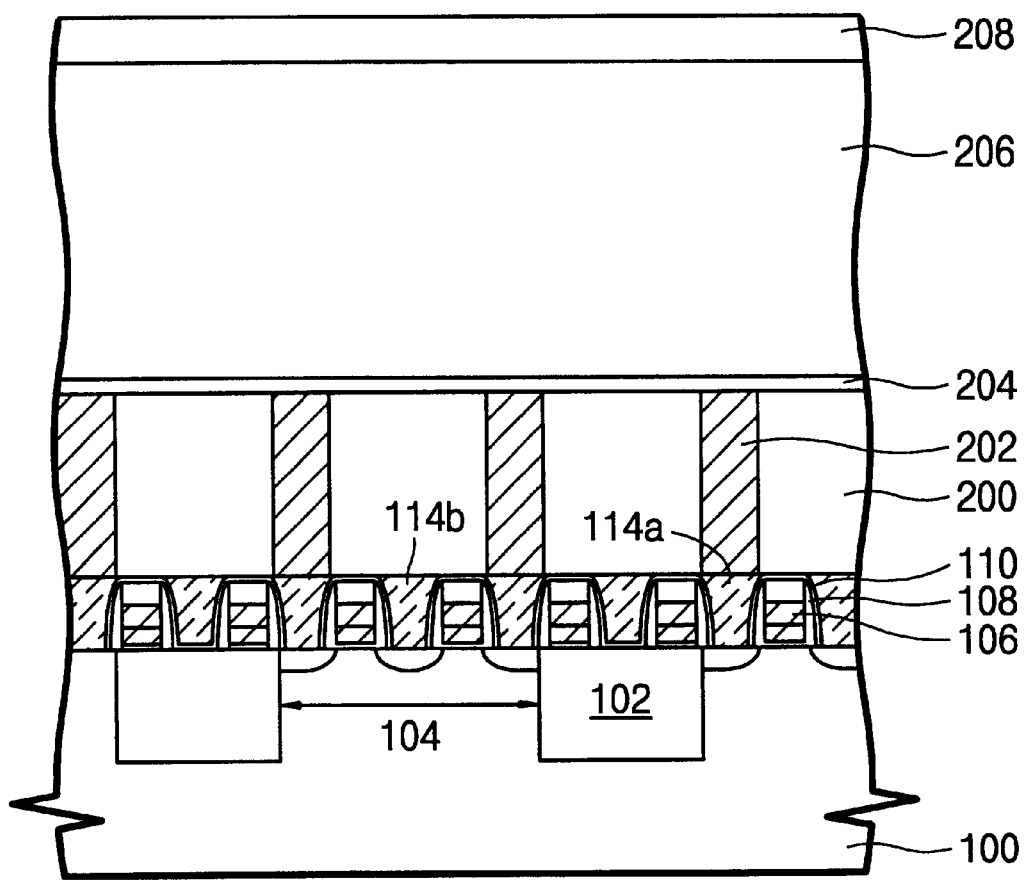

Referring now to FIGS. 4A and 4B, trench etching stopper nitride layer 204 formed of a material such as silicon nitride is deposited on the second interlayer insulating layer 200 including the buried contact plugs 202. The trench etching stopper nitride layer 204 is formed to a thickness of about 200 Angstroms to 500 Angstroms by an LPCVD (low-pressure chemical vapor deposition) or PECVD (plasma enhanced chemical vapor deposition) technique. A sacrificial oxide layer 206 is deposited on the silicon nitride layer 204 to a thickness of about 1.0 microns to 3.0 microns. The sacrificial oxide layer 206 can be formed of a PE-TEOS (plasma enhanced tetraethylorthosilicate) oxide.

Figure 5A:
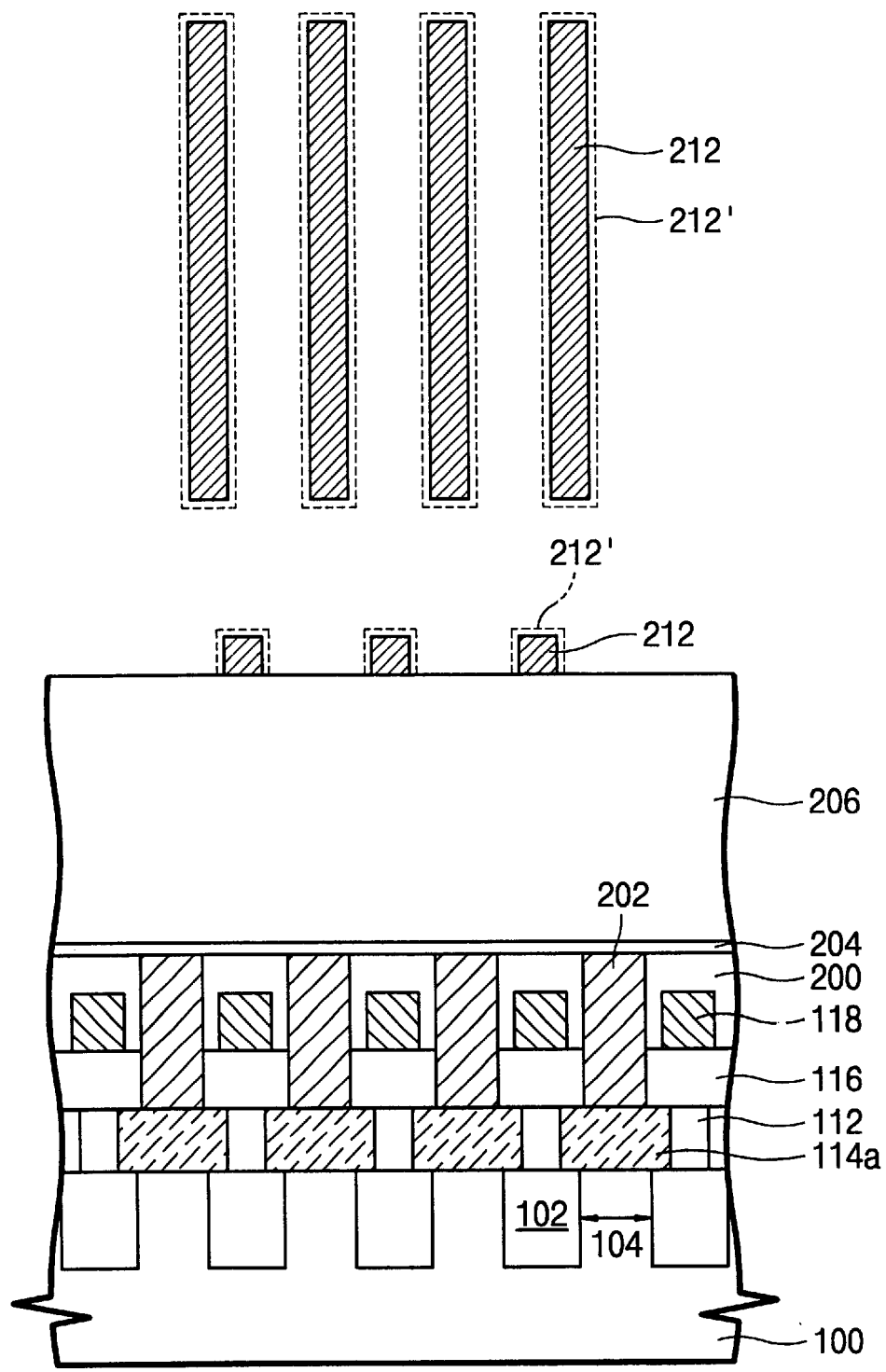

Next process sequence is the formation of a trench etching mask comprising first line patterns and second line patterns intersecting the first line patterns. A first material layer 208 for first line patterns is deposited on the sacrificial oxide layer 206 as shown in FIGS. 4A and 4B. The first material layer 208 is formed of a material that has an etching selectivity against underlying oxide layer 206. Preferably, polysilicon can be deposited as the first material layer to a thickness of about 500 Angstroms to 2,000 Angstroms. Alternatively, a silicon nitride layer or alumina ($Al_2O_3$) may be also used. A first photoresist layer is spin-coated on the first polysilicon layer 208 and patterned into a predetermined configuration (i.e., photoresist pattern) to have a minimum feature size corresponding to the design rule, i.e., in the range of 0.1 microns to 0.13 microns. Using the first photoresist pattern as a mask, the underlying first polysilicon layer 208 is etched to form first line patterns 210' that are parallel and spaced apart from each other as shown in FIG. 5A. The first line patterns 210' have a minimum feature size corresponding the first photoresist pattern, i.e., 0.1 microns to 0.13 microns. The first line patterns 210' run in a direction parallel to the gate line direction, i.e., intersect the bit lines 118.

Figure 5B:
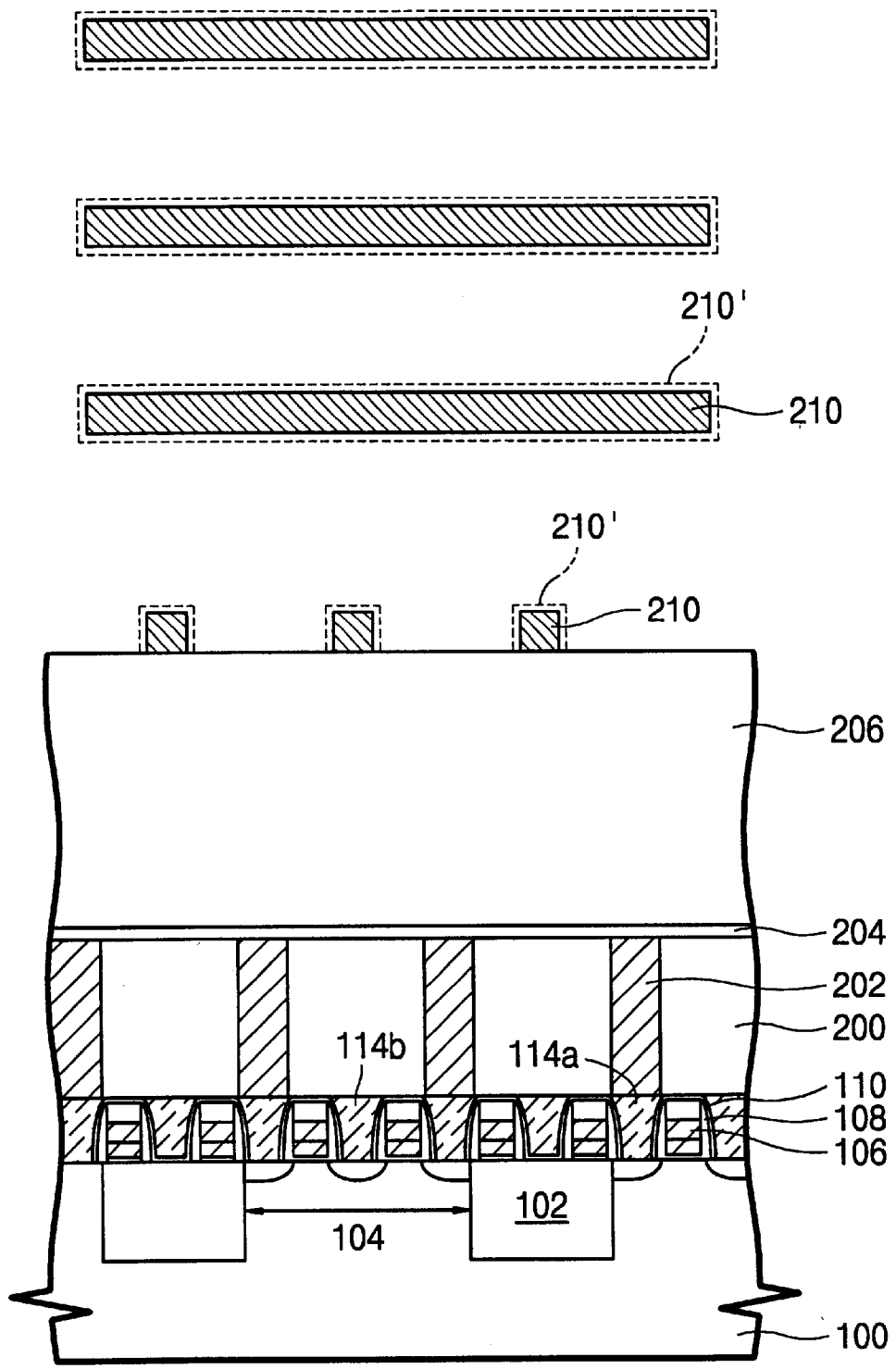

Next, a second material layer for second line patterns is deposited on the sacrificial oxide layer 206 and on the first line pattern 210'. The second material layer is formed of a material that has an etching selectivity against the underlying oxide layer 206. Preferably, polysilicon can be deposited as the second material layer to a thickness of about 500 Angstroms to 2,000 angstroms. Alternatively, a silicon nitride layer and alumina may be also used. A second photoresist layer is spin-coated on the first line patterns and on the sacrificial oxide layer 206 and patterned into a predetermined configuration (i.e., photoresist pattern) to have a minimum feature size corresponding to the design rule, i.e., in the range of 0.1 microns to 0.13 microns. Using the second photoresist pattern as a mask, the underlying second polysilicon layer is etched to form second line patterns 212' that are parallel and spaced apart from each other as shown in FIG. 5B. The second line patterns 212' have a minimum feature size corresponding to the second photoresist pattern, i.e., 0.1 microns to 0.13 microns. The second line patterns 212' run in a direction parallel to the bit lines 118 and intersect the first line patterns 210'. The intersecting first and second line patterns 210' and 212' together define a trench etching mask. Etching the first and second polysilicon layers uses a gas mixture of $Cl_2$, $SF_6$ and $N_2$ with a flow rate of about 40 sccm, 6 sccm and 6 sccm, respectively, at a power of about 400 to 600 W, and a pressure of about 10 mT to 15 mT.

Figure 9:
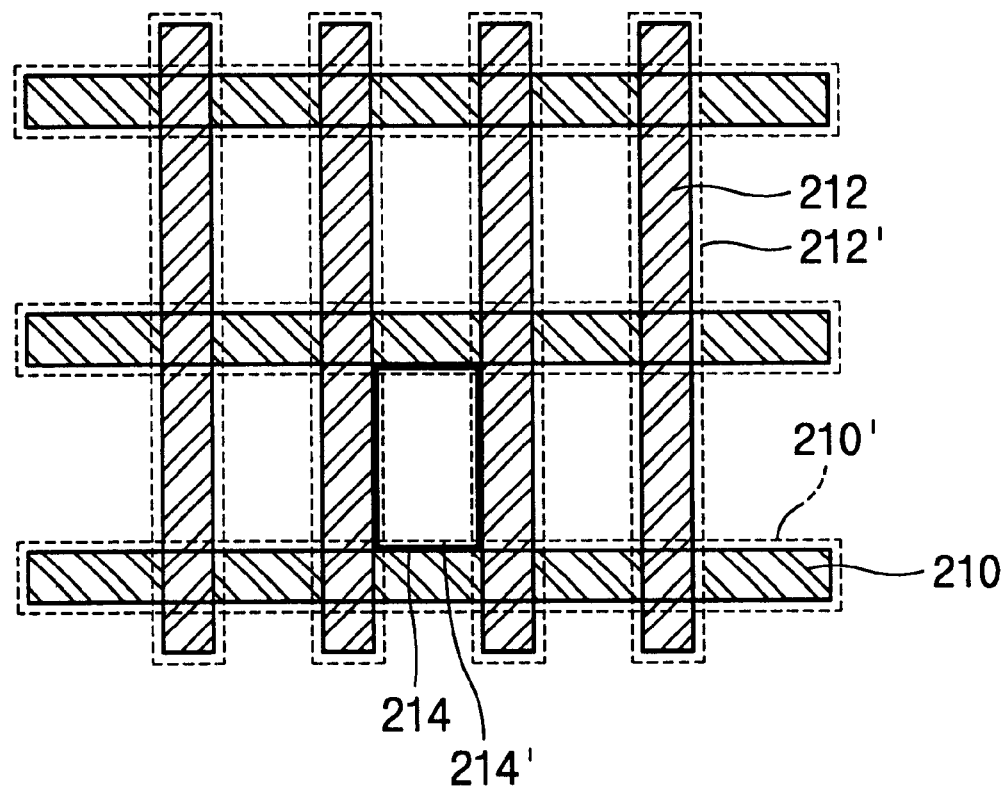
FIG. 9 shows schematically shows intersecting line patterns for etching trenches.

An isotropic etching process is carried out on the trench etching mask 214' to increase the dimension of trench formation region, reducing the minimum feature sizes of the first and second line patterns. The resulting trench etching mask 214 is schematically illustrated in FIG. 9. In FIG. 9, dotted lines 210' and 212' denote the trench etching mask before isotropic etching and continuing lines 210 and 212 denote the trench etching mask after isotropic etching. For example, if an initial trench etching mask defined by the dotted lines 210' and 212' has a minimum feature size of about 0.1 microns to 0.13 microns, a post-etching trench etching mask defined by continuing lines 210 and 212 has a minimum feature size of about 0.05 microns to 0.1 microns. An isotropic etching process can be carried out by using a wet etchant such as SCl ($NH_4OH:H_2O_2:H_2O=1:4:20$, 25° C.) or polysilicon etching solution ($HNO_3:HF:CH_3COOH:H_2O=40:1:2:20$, 25° C.).

Alternatively, enlarging the dimension of the trench formation regions can be carried out by oxidizing the trench etching mask 214' at a temperature of about 800 to 850° C. and subsequently etching the resulting oxide layer by using an buffer oxide etchant (BOE).

Figure 6A:
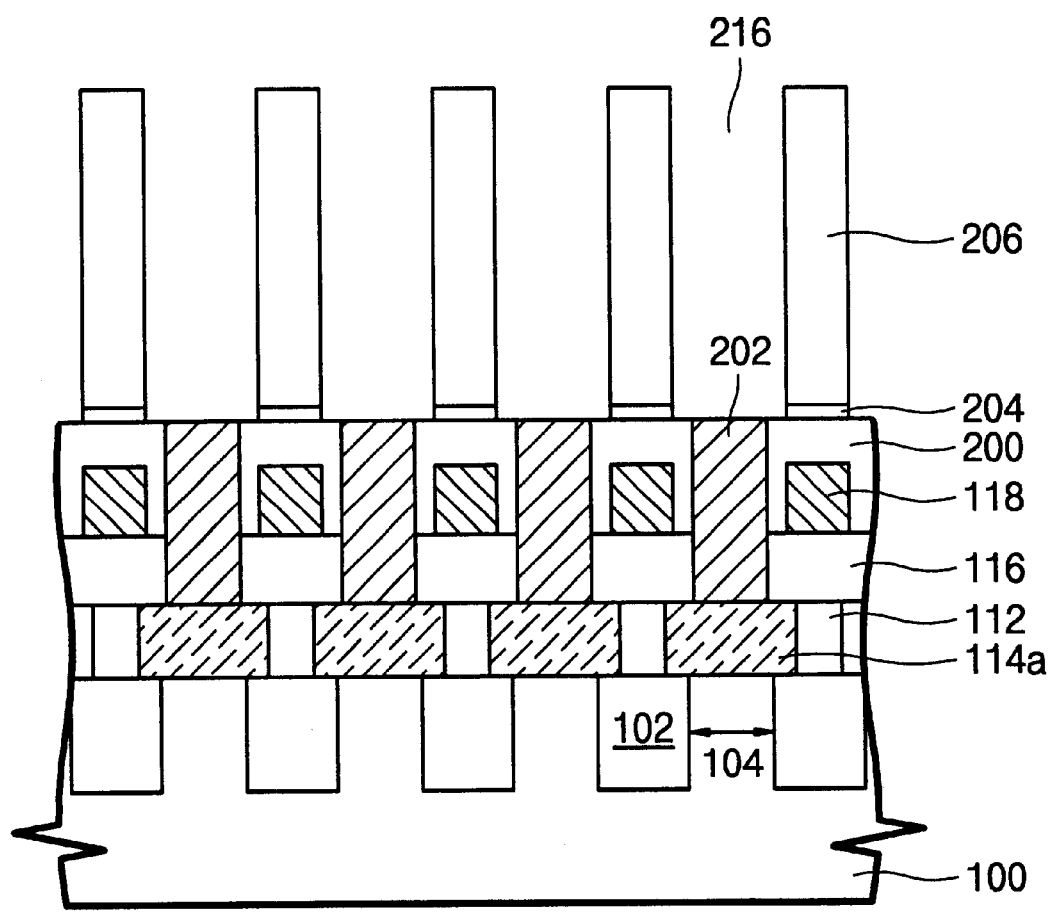
Figure 6B:
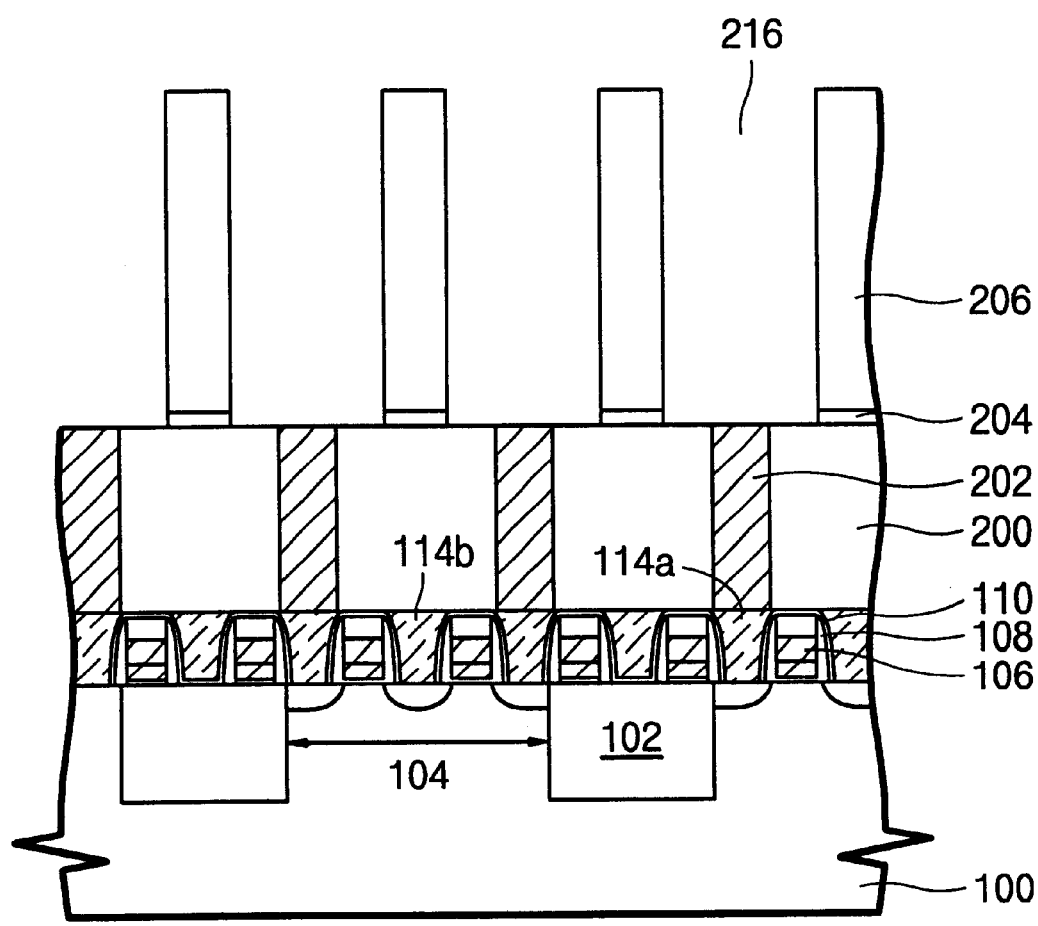

Using the trench etching mask 214, the exposed sacrificial oxide layer 206 is etched to form trenches 216 therein that expose corresponding buried contact plugs 202 as shown in FIGS. 6A and 6B. The trenches 216 have an increased area and decreased space between adjacent trenches.

Figure 7A:
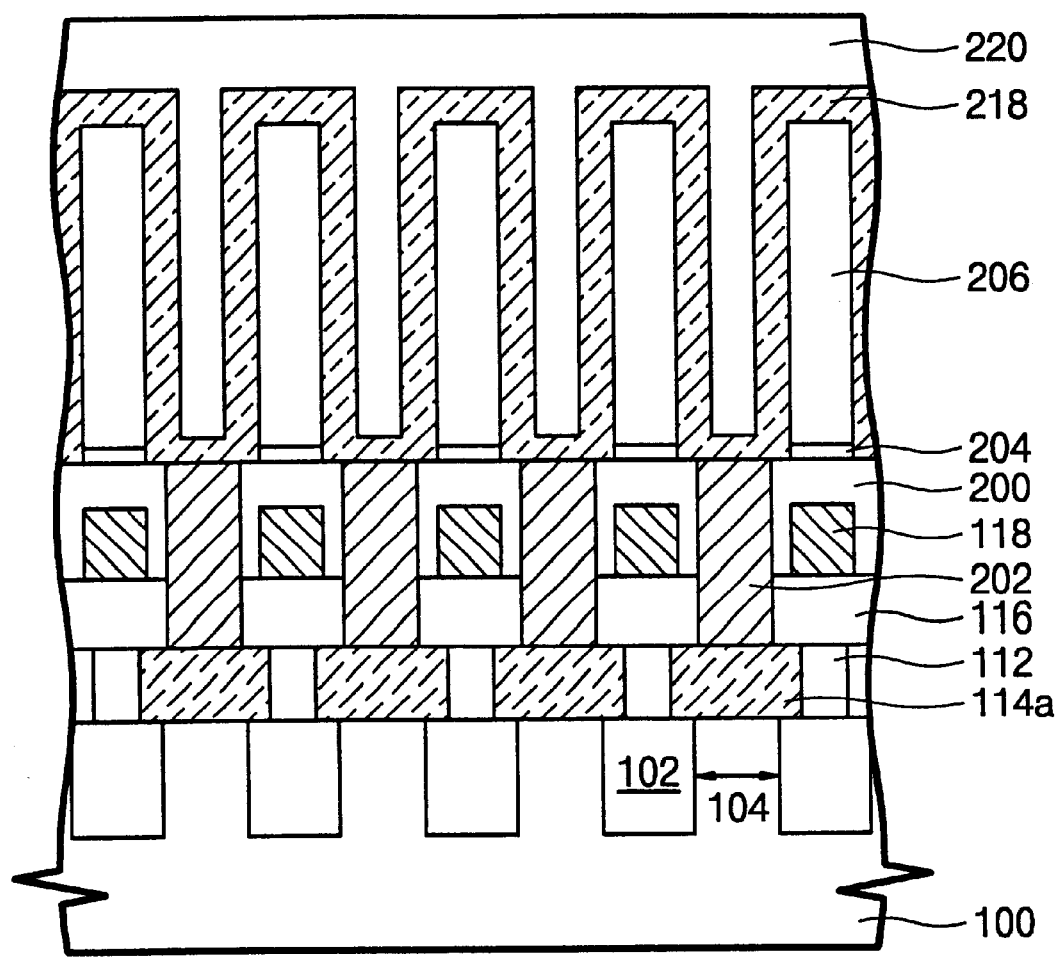
Figure 7B:
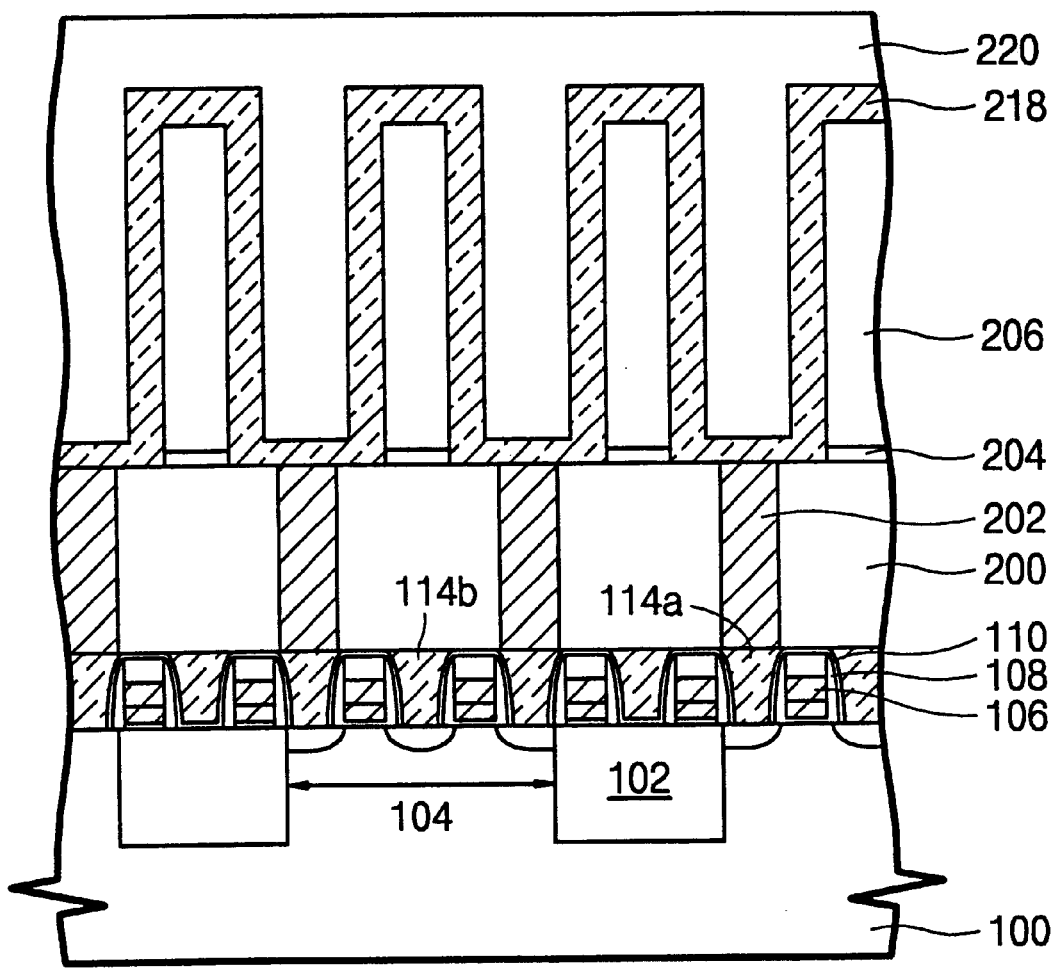

Referring to FIGS. 7A and 7B, a conductive material 218 such as polysilicon is deposited in the trenches 216 and on the sacrificial oxide layer 206 and follows the topology of the trenches 216. Then a planarization oxide layer 220 is deposited in the remainder of the trenches on the conductive material layer 218. A planarization process such as CMP is carried out until a top surface of the sacrificial oxide layer 206 is exposed so as to electrically isolate each of trenches 216 from one another.

Next, the planarization oxide layer in the trenches and the sacrificial oxide layer are simultaneously removed by wet etchant such as LAL solution, thereby forming cylindrical storage nodes.

Figure 8A:
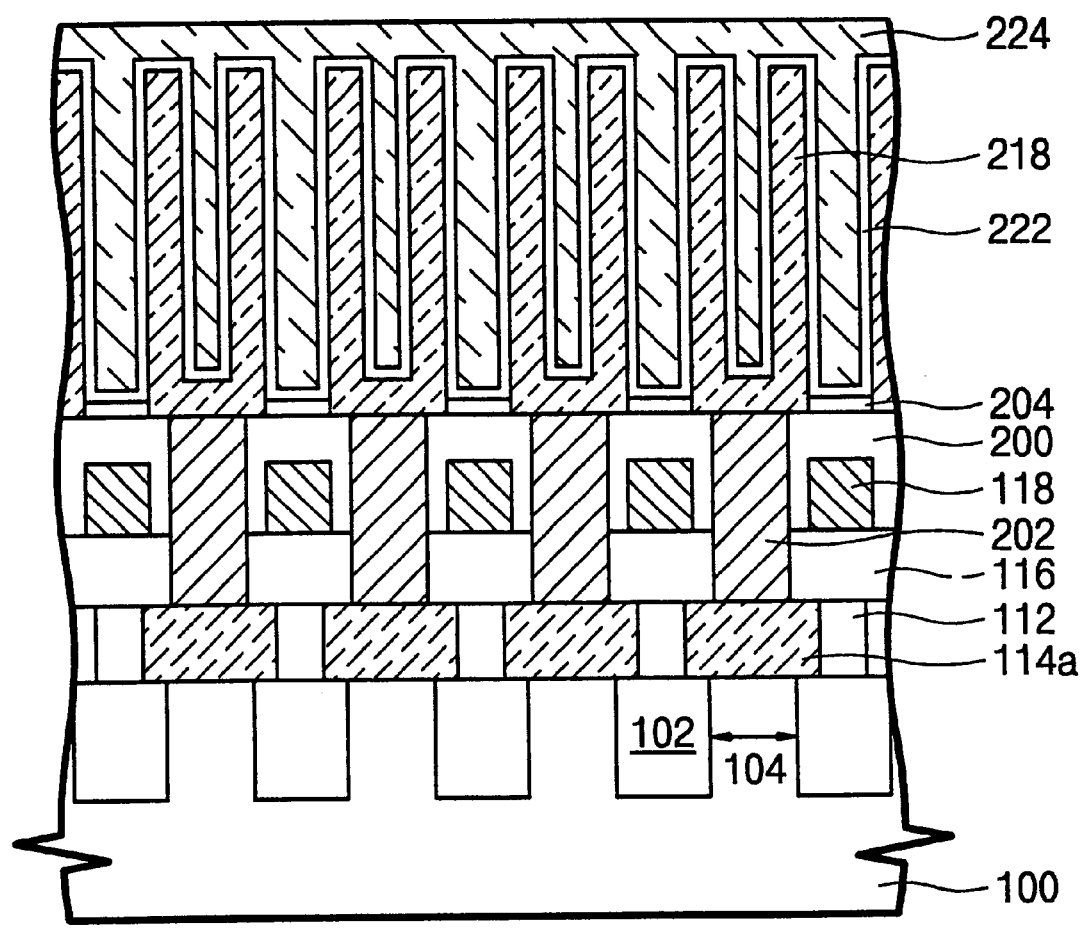
Figure 8B:
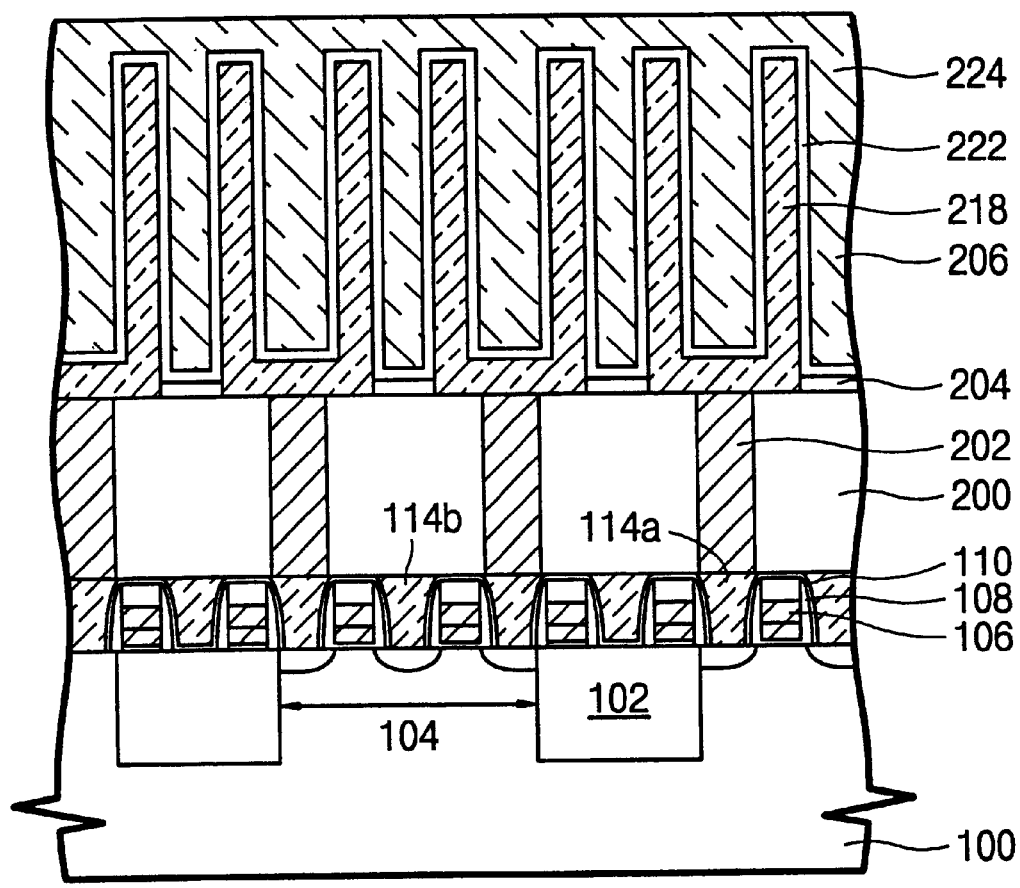

Referring now to FIGS. 8A and 8B, a capacitor dielectric film 222 and a conductive material for capacitor plate node 224 are deposited on the storage nodes including the trench etching stopper nitride layer 204.

The present invention provides a method of forming a trench in an insulating layer that exceeds the design rule, and more particularly to a method of forming a cylindrical capacitor in the trench. The trench is made by etching the insulating layer using a trench etching mask comprised of two intersecting line patterns. A two-step photolithography process is carried out to define first line patterns and second line patterns. The second line patterns are formed on the first line patterns to intersect the first patterns. The first and second line patterns are partially etched to reduce minimum line feature thereof, thereby increasing trench formation regions defined by the two intersecting line patterns.

It will be recognized by those skilled in the art that the innovative concepts disclosed in the present application can be applied in a wide variety of contexts. Moreover, the preferred implementation can be modified in a wide variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts.

What is claimed is:

1. A method of forming a trench in an insulating layer, the method comprising:

providing a semiconductor topology;

depositing an insulating layer on the semiconductor topology;

forming a first plurality of spaced apart and parallel patterns overlying the insulating layer;

forming a second plurality of spaced apart and parallel patterns on the first patterns to intersect the first patterns so that the intersecting first and second patterns defines a trench mask pattern; and etching the insulating layer, using the trench mask pattern, to form a plurality of trenches therein.

2. The method according to claim 1, wherein the first and second patterns are independently formed of a material that has an etching selectivity against the insulating layer.

3. The method according to claim 1, wherein the first and second patterns are independently formed of a material selected from the group consisting of polysilicon, alumina and nitride.

4. The method according to claim 1, further comprising etching isotropically the trench mask pattern before etching the insulating layer.

5. The method according to claim 4, further comprising forming an etching stopper layer prior to the depositing the insulating layer, so that the etching the trenches stops at the etching stopper layer.

6. The method according to claim 5, wherein the etching stopper layer is formed of nitride, the insulating layer is formed of oxide and the first and second patterns are formed of polysilicon.

7. The method according to claim 1, which further comprises performing an oxidation process on the trench mask pattern and removing an oxide layer formed by the oxidation process to reduce the sizes of first and second patterns.

8. The method according to claim 1, wherein the semiconductor topology includes a semiconductor substrate and a plurality of transistors formed thereon, wherein the trenches are formed to expose the semiconductor substrate between the transistors.

9. The method according to claim 8, further comprising depositing a conductive material in the trenches and on the transistors and planarizing the conductive material until a top surface of the transistors is exposed, to form a plurality of landing pads.

10. The method according to claim 1, further comprising depositing a conductive material in the trenches and patterning thereof to form a conductive line.

11. A method of forming a trench in an insulating layer in a semiconductor manufacturing comprising:

forming a transistor on a semiconductor substrate;

forming a landing pad on the semiconductor substrate adjacent the transistor;

forming a first insulating layer on the semiconductor substrate including the transistor and the landing pad;

forming a contact plug in the first insulating layer to be electrically connected to the landing pad;

forming a second insulating layer overlying the first insulating layer;

forming a first plurality of spaced apart and parallel patterns overlying the second insulating layer;

forming a second plurality of spaced apart and parallel patterns on the first patterns to intersect the first patterns, wherein intersecting first and second patterns defines a trench mask pattern;

etching the underlying second insulating layer, using the intersecting first and second patterns, to form a trench to the contact plug;

depositing a conductive material in the trench and on the second insulating layer;

depositing a third insulating layer on the conductive material layer to fill the trenches;

planarizing the third insulating layer and the conductive material until a top surface of the second insulating layer is exposed; and removing the third insulating layer in the trench and the second insulating layer outside of the trenches to form a storage node.

12. The method according to claim 11, further comprising enlarging trench regions defined by the trench mask pattern.

13. The method according to claim 12, wherein the enlarging the trench regions defined by the trench mask pattern comprises oxidizing the trench mask pattern to form an oxide layer thereof and removing the oxide layer.

14. The method according to claim 12, wherein the enlarging the trench regions defined by the trench mask pattern comprises etching the trench mask pattern with a wet etchant.

15. The method according to claim 13 or 14, wherein first and second patterns have a minimum feature size of about 0.1 to 0.15 microns and the etched-trench etching mask has a minimum feature size of about 0.05 to 0.1 microns.

16. The method according to claim 11, wherein the first and second patterns are independently formed of a material selected from the group consisting of polysilicon, alumina and nitride.

* * * * *